(12) United States Patent
Uno et al.

(10) Patent No.: US 7,332,754 B2
(45) Date of Patent: Feb. 19, 2008

(54) SEMICONDUCTOR SWITCH

(75) Inventors: Takashi Uno, Takarazuka (JP);
Manabu Yanagihara, Toyonaka (JP);
Hidetoshi Ishida, Kyoto (JP); Tsuyoshi Tanaka, Neyagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 262 days.

(21) Appl. No.: 11/022,814

(22) Filed: Dec. 28, 2004

(65) Prior Publication Data
US 2005/0151208 A1    Jul. 14, 2005

(30) Foreign Application Priority Data
Jan. 8, 2004    (JP)    ............... 2004-002533

(51) Int. Cl.
*H01L 29/80*    (2006.01)
(52) U.S. Cl. ............... 257/282; 257/280; 257/281; 257/E29.122
(58) Field of Classification Search ............... 257/192, 257/280–284, E29.041, E29.116, E29.122, 257/E29.178, E29.265, E29.268, E29.279, 257/E29.317, E29.32; 438/167
See application file for complete search history.

(56) References Cited

U.S. PATENT DOCUMENTS 6,004,838 A * 12/1999 Ma et al. ............... 438/200
6,255,695 B1 * 7/2001 Kubota et al. ............... 257/351

FOREIGN PATENT DOCUMENTS

JP    10-50728    2/1998

* cited by examiner

*Primary Examiner*—Minhloan Tran
*Assistant Examiner*—Benjamin Tzu-Hung Liu
(74) *Attorney, Agent, or Firm*—Steptoe & Johnson LLP

(57) ABSTRACT

In the semiconductor switch of the present invention, the gate electrode, source electrode and drain electrode are formed such that the distance between the gate and the drain of an MESFET, assuming a shunt FET, is longer than the distance between the gate and the drain of an MESFET, assuming a through FET, so that the gate breakdown voltage of the MESFET, assuming a shunt FET, is increased without changing the gate breakdown voltage of the MESFET, assuming a through FET.

3 Claims, 7 Drawing Sheets

SEMICONDUCTOR SWITCH

BACKGROUND OF THE INVENTION

1. Field of the Invention

The present invention relates to a semiconductor device, more particularly to an SPnT (Single-Pole-n-Throw) switch (1 input n outputs switch) (n is 1 or a higher integer) or an nPST (n-Pole-Single-Throw) switch (n inputs 1 output switch) (n is 1 or a higher integer) using a GaAs MESFET (MEtal Semiconductor Field Effect Transistor).

2. Description of the Related Art

In a high frequency switch device which directly switches high frequency signals from several MHz to several tens GHz, a mechanical switch (relay) and a semiconductor switch are known. A semiconductor switch is widely used in the mobile communication field because of such features as high-speed switching, compactness, light weight and superb reliability. Particularly an SPDT (Single-Pole-Dual-Throw) switch (1 input 2 outputs switch) using a GaAs MESFET, which has such features as high-speed operation and in theory almost zero power consumption, is widely used for the antenna selector switch of a mobile communication terminal and other components which demand compactness and light weight.

Now a conventional semiconductor switch will be described with reference to FIG. 1.

FIG. 1 is a circuit diagram depicting a unit switch comprised of an SPST (Single-Pole-Single-Throw) switch, which constitutes a conventional SPnT switch.

As FIG. 1 shows, the SPnT switch is normally comprised of n number of unit switches 16 further comprising a through FET 11 where one of the source electrode and the drain electrode is connected to the input terminal, and the other is connected to the output terminal, and a shunt FET 12 where one of the source electrode and the drain electrode is connected to the output side of the through FET 11 and the other is grounded. The through FET 11 is a transfer gate, and the shunt FET 12 is disposed for improving isolation between input and output. In FIG. 1, 13A and 13B are the bias resistors for preventing the leakage of high frequency signals into the control terminals 14A and 14B.

SUMMARY OF THE INVENTION

The following problems exists in the configuration of a conventional transmission/reception switching GaAs switch.

Normally a same FET is used for the through FET 11 and the shunt FET 12 at the transmission side, but as the signal level increases and the potential fluctuation of the drain in the shunt FET 12 at the transmission side increases during the transmission operation as the signal power increases, the potential difference between the gate and the drain of the FET 12 increases, and reaches the gate breakdown voltage of the shunt FET 12, which may generate signal distortion due to the deterioration of shunt FET characteristics.

To solve the above problem, it is an object of the present invention to provide a semiconductor device comprising a switch circuit where a shunt FET and a through FET are arrayed, wherein signal distortion due to the fluctuation of the drain potential of the shunt FET is suppressed.

To achieve the above object, a semiconductor switch of the present invention comprises one or a plurality of input terminals, one or a plurality of output terminals, one or a plurality of first FETs where one of the source electrode and the drain electrode is connected to the input terminal side and the other is connected to the output terminal side, and one or a plurality of second FETs connected in series where one of the source electrode and the drain electrode is connected to the output terminal side and the other is grounded, wherein a distance between the gate electrode and the drain electrode of the second FET is longer than a distance between the gate electrode and the drain electrode of the first FET.

Another semiconductor switch of the present invention comprises one or a plurality of input terminals, one or a plurality of output terminals, one or a plurality of first FETs where one of the source electrode and the drain electrode is connected to the input terminal side and the other is connected to the output terminal side, and one or a plurality of second FETs connected in series where one of the source electrode and the drain electrode is connected to the output terminal side and the other is grounded, wherein a distance between the source electrode and the drain electrode of the second FET is the same as a distance between the source electrode and the drain electrode of the first FET, and a distance between the gate electrode and the drain electrode of the second FET is longer than a distance between the gate electrode and the drain electrode of the first FET.

Another semiconductor switch of the present invention comprises one or a plurality of input terminals, one or a plurality of output terminals, one or a plurality of first FETs where one of the source electrode and the drain electrode is connected to the input terminal side and the other is connected to the output terminal side, and one or a plurality of second FETs connected in series where one of the source electrode and the drain electrode is connected to the output terminal side and the other is grounded, wherein a threshold voltage of the second FET is higher than a threshold voltage of the first FET.

Another semiconductor switch of the present invention comprises one or a plurality of input terminals, one or a plurality of output terminals, one or a plurality of first FETs where one of the source electrode and the drain electrode is connected to the input terminal side and the other is connected to the output terminal side, and one or a plurality of second FETs connected in series where one of the source electrode and the drain electrode is connected to the output terminal side and the other is grounded, wherein a recess depth of the second FET is deeper than a recess depth of the first FET.

Another semiconductor switch of the present invention comprises one or a plurality of input terminals, one or a plurality of output terminals, one or a plurality of first FETs where one of the source electrode and the drain electrode is connected to the input terminal side and the other is connected to the output terminal side, and one or a plurality of second FETs connected in series where one of the source electrode and the drain electrode is connected to the output terminal side and the other is grounded, wherein a gate length of the second FET is longer than a gate length of the first FET.

DESCRIPTION OF THE PREFERRED EMBODIMENTS

Means used for a semiconductor switch of the present invention employs controlling signal distortion caused by deterioration of characteristics of a shunt FET by setting a gate breakdown voltage higher than potential difference between a gate and a drain of the shunt FET.

The gate breakdown voltage has a strong correlation with resistance at switch ON, and increasing the gate breakdown voltage leads to an increase of the resistance value at switch ON. The resistance value at switch ON correlates with an insertion loss, and the increase of resistance at switch ON increases the insertion loss. To prevent the insertion loss, the gate breakdown voltage of the shunt FET is increased without changing the gate breakdown voltage of a through FET, then signal distortion can be suppressed without affecting the insertion loss.

Now characteristics of the gate breakdown voltage in a general FET will be described.

Figure 1:
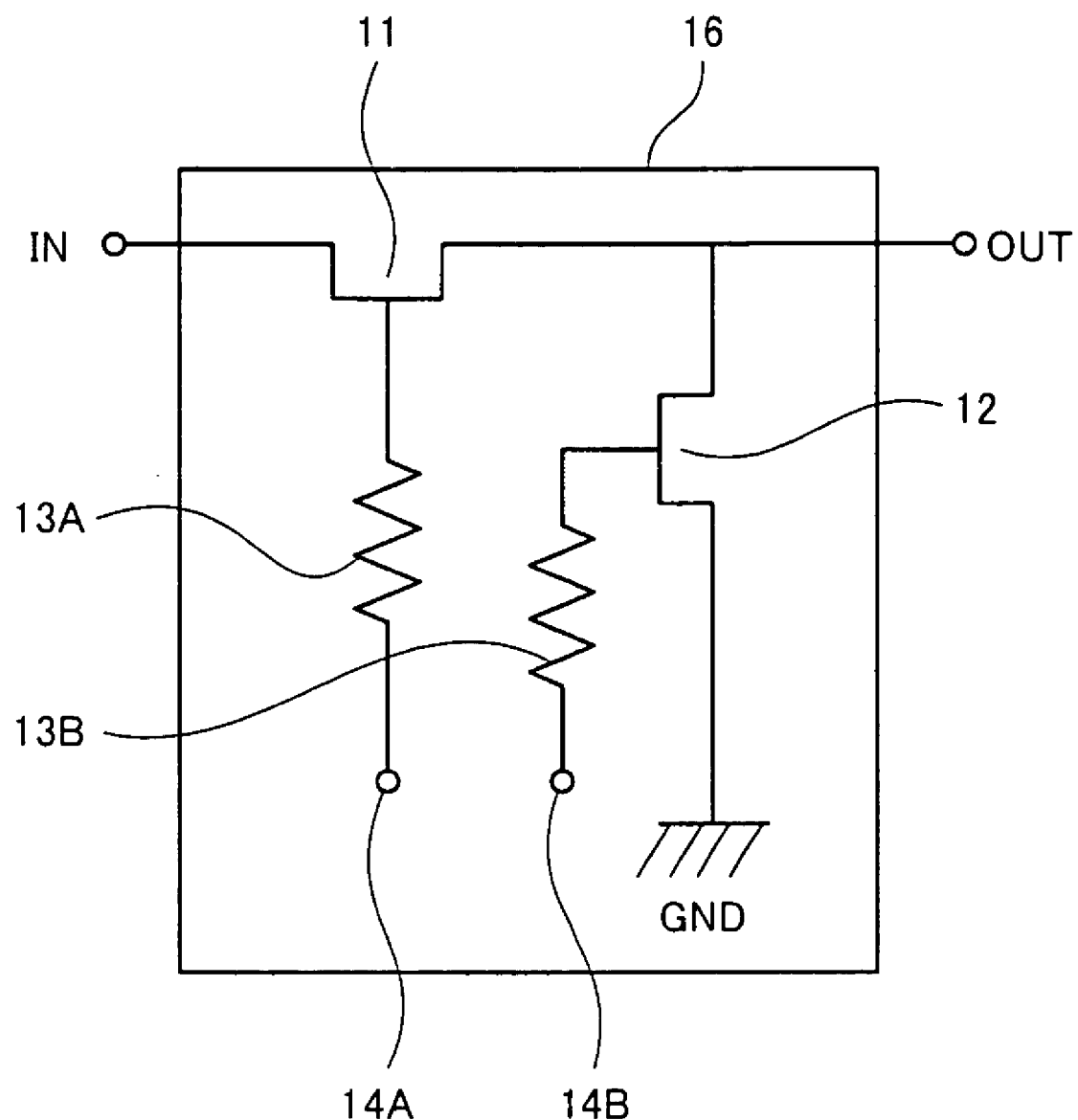
FIG. 1 is a circuit diagram depicting a unit switch comprised of an SPST switch constituting a conventional SPnT switch.
Figure 2A:
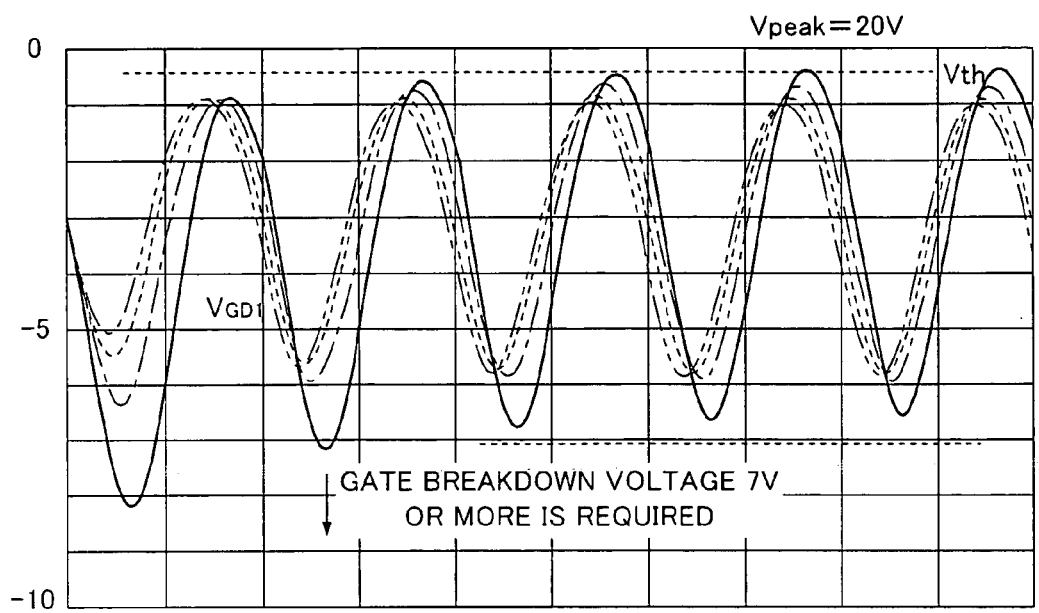
FIG. 2A is a graph depicting simulation results of fluctuations of potential that is applied between a gate and a drain of a four-stage shunt FET when a signal with a 20 V amplitude is input.
Figure 2B:
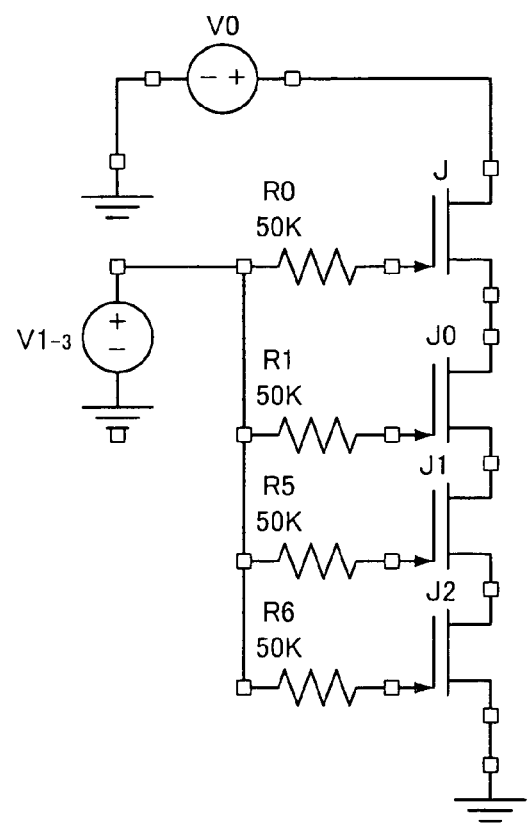
FIG. 2B is a circuit diagram depicting a shunt FET (four stages) used for the simulation.

FIG. 2A is a graph depicting a simulation of fluctuations of potential which is applied between the gate and the drain of a four-stage shunt FET when signals with a 20 V amplitude is input, and FIG. 2B is a circuit diagram depicting the shunt FET (four-stage) used for the simulation.

For this calculation, it is assumed that the four FETs have exactly the same characteristics, where the control voltage is −3V and the resistance connected to each gate is 50 kΩ. FIG. 2A shows a voltage applied between the gate and the drain of each FET, and a required gate breakdown voltage can be derived by this.

FIG. 2A shows the calculation result when the amplitude of an input signal is 20V, where the solid line shows the potential difference between the gate and the drain. Since the potential difference between the gate and the drain is 7V or less in waveforms at the third cycle or later in which the circuit stabilizes, the required gate breakdown voltage is 7V or more.

Figure 3:
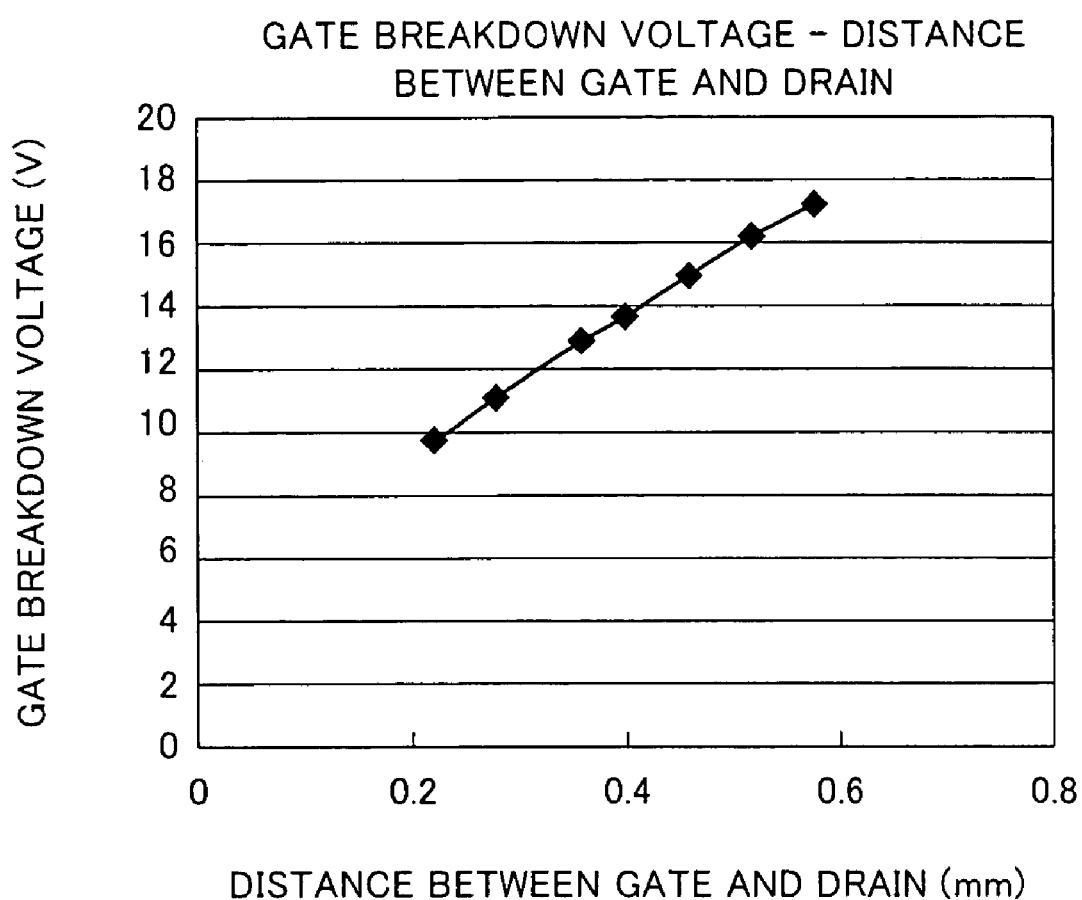
FIG. 3 is a graph depicting a relationship between a gate breakdown voltage and a distance between the gate and the drain.

FIG. 3 is a graph depicting a relationship between the gate breakdown voltage and the distance between the gate and the drain.

As the distance between the gate and the drain increases, the gate breakdown voltage increases because an electric field applied between the gate and the drain is reduced. By increasing the distance between the gate and the drain of the shunt FET, the gate breakdown voltage increases, and such a status can be prevented that a potential difference between the voltage amplitude of the signal to be input to the shunt FET and the gate potential reaches the gate breakdown voltage and generates signal distortion.

Figure 4A:
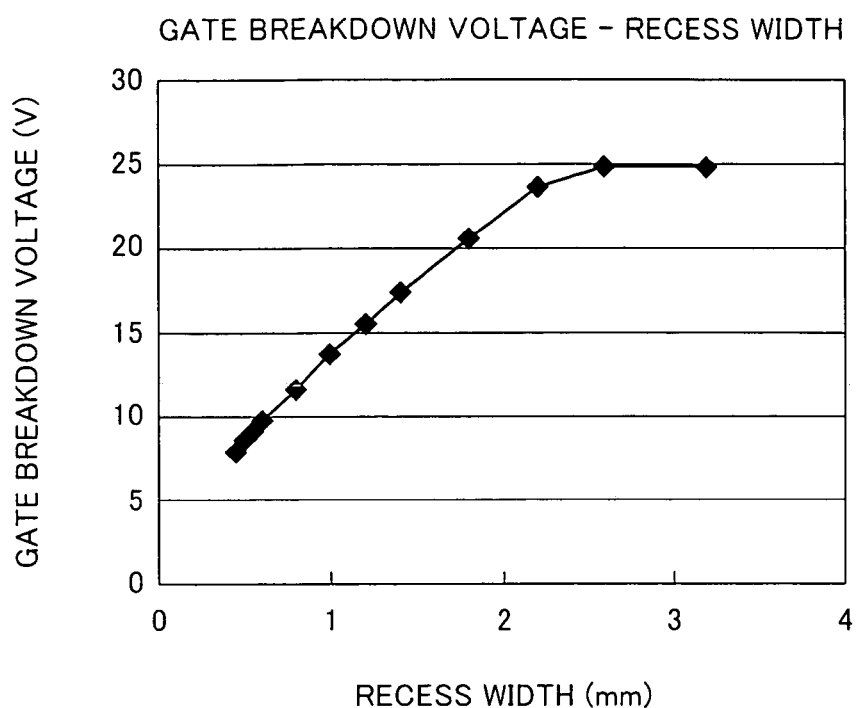
FIG. 4A is a graph depicting a relationship between the gate breakdown voltage and a recess width of an FET.
Figure 4B:
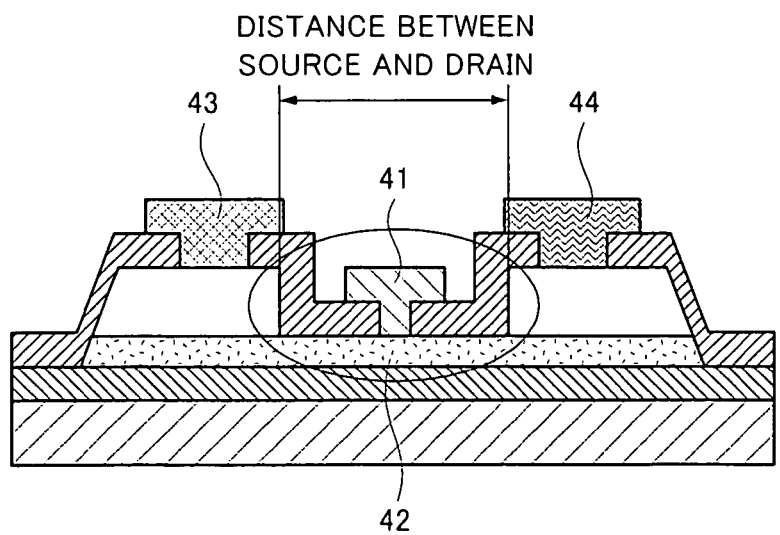
FIG. 4B is a diagram depicting a cross-sectional structure of a general FET.

FIG. 4A is a graph depicting a relationship between the gate breakdown voltage and a recess width of the FET, and FIG. 4B is a diagram depicting a cross-sectional structure of a general FET.

Recess 42 is a concave section created in an area where a gate electrode 41 is formed, and the distance between a source 43 and a drain 44 is determined by the width of the recess 42. Increasing the width of the recess 42 leads to increasing the distance between the source and the drain, that also increases the distance between the gate and the drain. Therefore, increasing the recess width increases the gate breakdown voltage.

In other words, by increasing the distance between the gate and the drain of the shunt FET, the gate breakdown voltage increases, and it becomes possible to prevent the status where the potential difference between the voltage amplitude of the signal to be input to the shunt FET and the gate potential reaches the gate breakdown voltage and generates signal distortion.

Also increasing a threshold voltage of the shunt FET weakens the electric field intensity under the gate electrode when an inverse bias is applied to the gate, which increases the gate breakdown voltage, and a status where the potential difference between the voltage amplitude of the signal to be input to the shunt FET and the gate potential reaching the gate breakdown voltage and the generation of signal distortion can be prevented.

Figure 5:
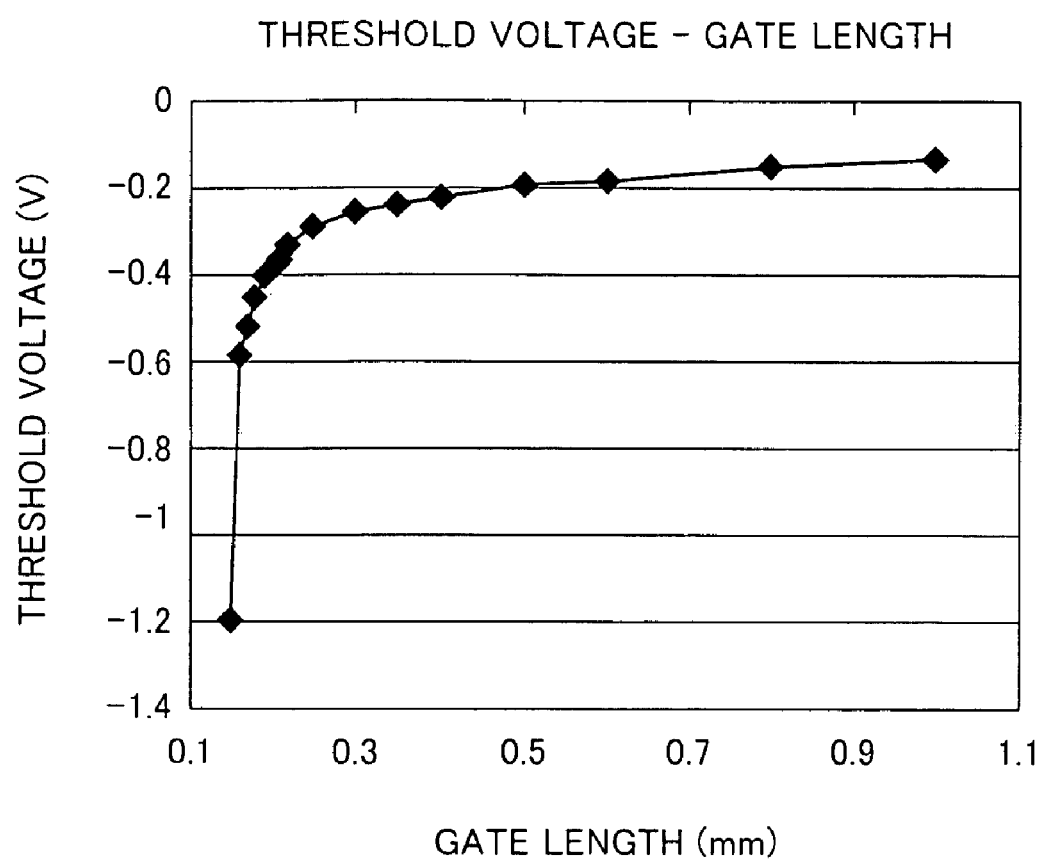
FIG. 5 is a graph depicting a relationship between a threshold value and a gate length.

FIG. 5 is a graph depicting a relationship between the threshold value and the gate length.

FIG. 5 shows that increasing the gate length increases the threshold voltage.

By increasing the gate length of the shunt FET, threshold voltage increases, which increases the gate breakdown voltage, and a status where the potential difference between the voltage amplitude of the signal to be input to the shunt FET and the gate potential reaching the gate breakdown voltage and the generation of signal distortion can be prevented.

Now embodiments of the present invention will be described with reference to the drawings.

Embodiment 1

Figure 6:
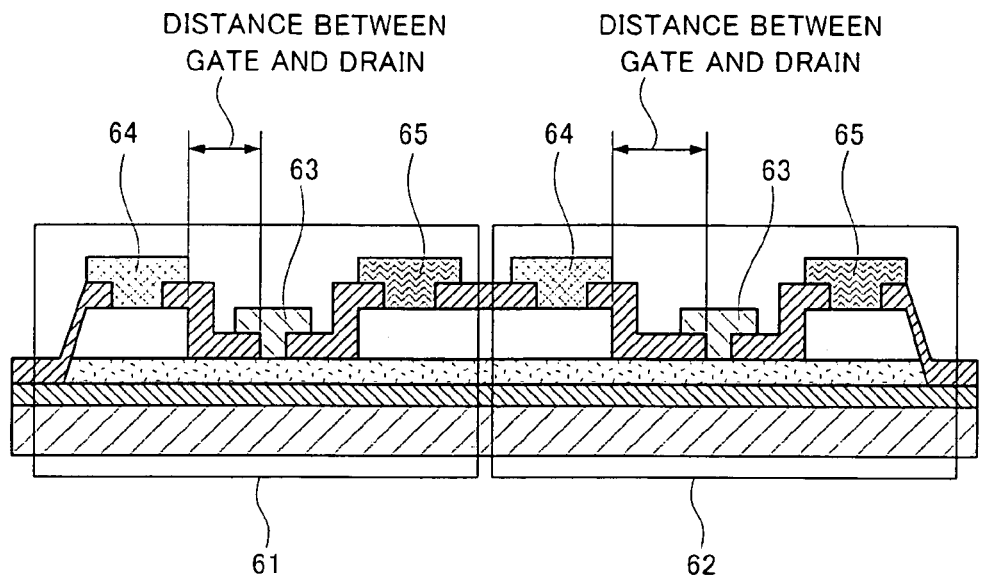
FIG. 6 is a cross-sectional view depicting an MESFET according to Embodiment 1.

FIG. 6 is a cross-sectional view of an MESFET according to Embodiment 1 of the present invention.

As FIG. 6 shows, in the distance between the gate and the drain of an MESFET 61, assuming a through FET, and an MESFET 62, assuming a shunt FET, the gate electrodes 63, the source electrodes 65, and drain electrodes 64 are formed such that the distance between the gate and the drain of the MESFET 62, assuming a shunt FET, is longer than that of the MESFET 61.

By setting the distance between the gate and the drain of the MESFET 62, assuming the shut FET, longer in the distance between the gate and the drain of the MESFET 61, assuming a through FET, and the MESFET 62, assuming a shunt FET, the gate breakdown voltage of the MESFET 62, assuming a shunt FET, can be increased without changing the gate breakdown voltage of the MESFET 61, assuming a through FET. Because of this, reaching the potential difference between the drain and the gate of the shunt FET to the gate breakdown voltage can be prevented, and signal distortion can be suppressed without affecting the insertion loss.

In FIG. 6, the distance between the gate and the source is the same for both the MESFET 62, assuming a through FET, and the MESFET 62, assuming a shunt FET, but both may have different lengths.

Embodiment 2

Figure 7:
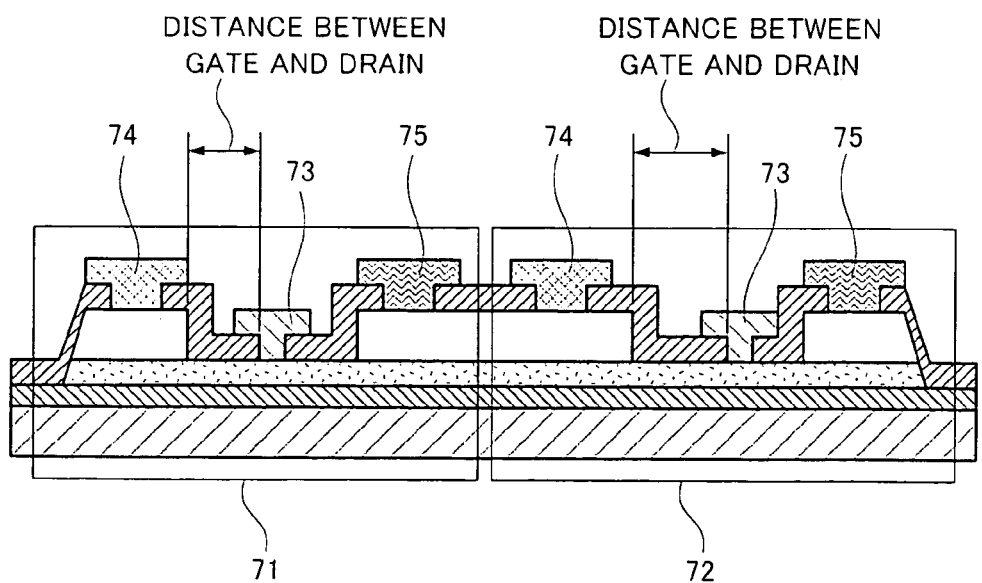
FIG. 7 is a cross-sectional view depicting an MESFET according to Embodiment 2.

FIG. 7 is a cross-sectional view of an MESFET according to Embodiment 2 of the present invention.

As FIG. 7 shows, in the distance between the source and the drain of an MESFET 71, assuming a through FET, and an MESFET 72, assuming a shunt FET, a gate electrode 73, a source electrode 75 and a drain electrode 74 are formed such that the distance between the source and the drain of the MESFET 72, assuming a shunt FET, is longer than that of the MESFET 71.

Unlike Embodiment 1, the recess width is the same for the MESFET 71 and the MESFET 72.

By setting the distance between the source and the drain of the MESFET 72, assuming a shunt FET, longer in the distance between the source and the drain of the MESFET 71, assuming a through FET, and the MESFET 72, assuming a shunt FET, the gate breakdown voltage of the MESFET 72, assuming a shunt FET, can be increased without changing the gate breakdown voltage of the MESFET 71. Because of this, reaching the potential difference between the drain and the gate of the shunt FET to the gate breakdown voltage can be prevented, and signal distortion can be suppressed without affecting the insertion loss.

Embodiment 3

Figure 8:
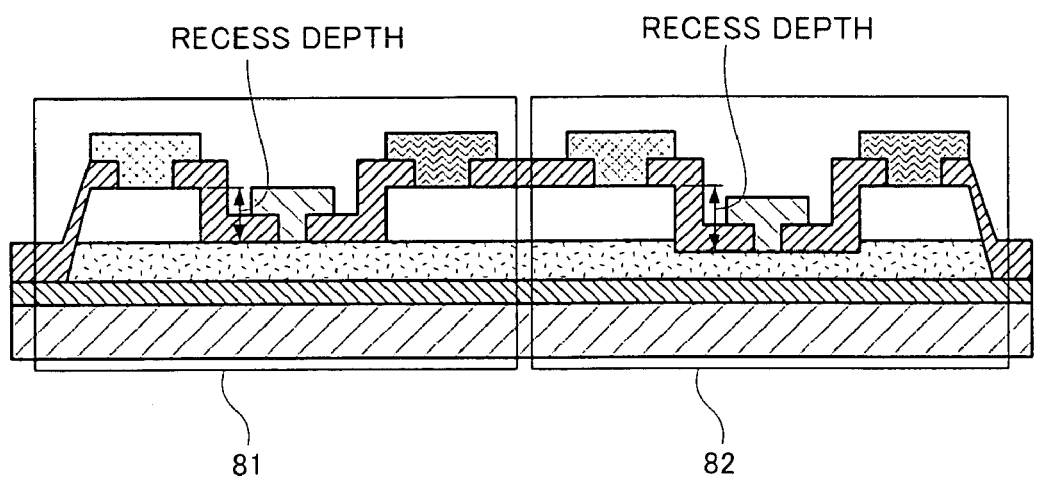
FIG. 8 is a cross-sectional view depicting an MESFET according to Embodiment 3.

FIG. 8 is a cross-sectional view of an MESFET according to Embodiment 3 of the present invention.

As FIG. 8 shows, by performing recess etching independently so that the depth of etching in the recess of an MESFET 82, assuming a shunt FET, becomes deeper than the depth of etching of an MESFET 81, assuming a through FET, the distance up to a channel changes, and the MESFET 82, assuming a shunt FET, of which threshold voltage is higher than the MESFET 81, assuming a through FET, can be created.

By increasing the etching depth of the recess depth of only the MESFET 82, assuming a shunt FET, while maintaining the etching depth of the MESFET 81, assuming a through FET, the threshold voltage of the MESFET 82, assuming a shunt FET, becomes higher than the threshold voltage of the MESFET 81, assuming a through FET, and the gate breakdown voltage of the MESFET 82, assuming a shunt FET, can be increased without changing the gate breakdown voltage of the MESFET 81, assuming a through FET. Because of this, reaching the potential difference between the drain and the gate of the shunt FET to the gate breakdown voltage can be prevented, and signal distortion can be suppressed without affecting the insertion loss.

Embodiment 4

Figure 9:
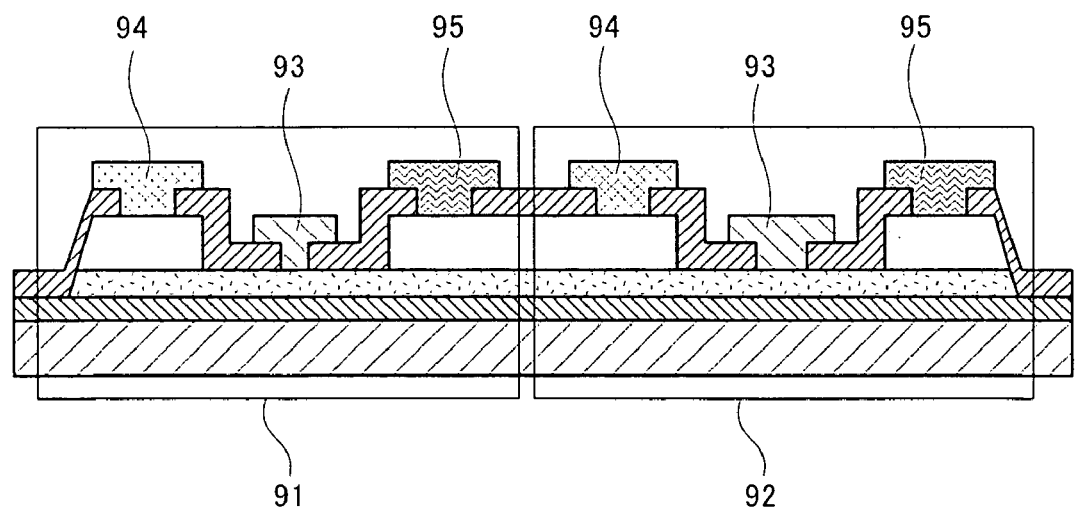
FIG. 9 is a cross-sectional view depicting an MESFET according to Embodiment 4.

FIG. 9 is a cross-sectional view of an MESFET according to Embodiment 4 of the present invention.

As FIG. 9 shows, a gate electrode 93, a source electrode 95 and a drain electrode 94 are formed so that the gate length of an MESFET 92, assuming a shunt FET, becomes longer than the gate length of an MESFET 91, assuming a through FET.

By manufacturing the gate length of the MESFET 92, assuming a shunt FET, to become longer while maintaining the gate length of the MESFET 91, assuming a through FET, the gate breakdown voltage of the MESFET 92, assuming a shunt FET, can be increased without changing the gate breakdown voltage of the MESFET 91, assuming a through FET. Because of this, the potential difference between the drain and the gate of the shunt FET can be prevented from reaching the gate breakdown voltage, and signal distortion can be suppressed without affecting the insertion loss.

In the above embodiments, a semiconductor switch using an MESFET was described, but an embodiment is possible for an FET with any substrate material, such as GaN.

The semiconductor switch of the present invention is also effective when a semiconductor switch with multi-input or multi-output is constructed, or may be of a configuration comprising a plurality of input terminals and output terminals respectively, or of a configuration comprising a plurality of stages of FETs.

What is claimed is:

1. A semiconductor switch, comprising:
   at least one input terminal;
   at least one output terminal;
   at least one first FET comprising a source electrode and a drain electrode, one of said source electrode and drain electrode connected to said input terminal and the other connected to said output terminal, such that if there are at least two first FETs, the at least two first FETs are connected in series, and at least one of said source electrode and drain electrode of one of said first FETs is connected to said input terminal and the other of said source electrode and drain electrode of another of said first FETs is connected to said output terminal; and
   at least one second FET comprising a source electrode and a drain electrode, one connected to said output terminal side and the other grounded, such that if there are at least two second FETs, the at least two second FETs are connected in series, and at least one of said source electrode and drain electrode of one of the second FETs is connected to said output terminal and the other of said source electrode and drain electrode of another of the second FETs is grounded, wherein
   a distance between the gate electrode and the drain electrode of each of said at least one second FET is longer than a distance between the gate electrode and the drain electrode of any of said at least one first FET.

2. The semiconductor switch of claim 1, wherein said at least one second FET further comprises a gate electrode, and the distance between the gate electrode and the drain electrode of each of said at least one second FET is larger than a distance between the gate electrode and the source electrode of said at least one second FET.

3. A semiconductor switch, comprising:
   at least one input terminal;
   at least one output terminal;
   at least one first FET comprising a gate electrode, a source electrode, and a drain electrode, one of said source electrode and drain electrode connected to said input terminal and the other connected to said output terminal, such that if there are at least two first FETs, the at least two first FETs are connected in series, and at least one of said source electrode and drain electrode of one of said first FETs is connected to said input terminal and the other of said source electrode and drain electrode of another of said first FETs is connected to said output terminal; and
   at least one second FET comprising a gate electrode, a source electrode, and a drain electrode, one of said source electrode and drain electrode connected to said output terminal and the other grounded, such that if there are at least two second FETs, the at least two second FETs are connected in series, and at least one of said source electrode and drain electrode of one of the second FETs is connected to said output terminal and the other of said source electrode and drain electrode of another of the second FETs is grounded, wherein a distance between the source electrode and the drain electrode of each of said at least one second FET is the same as a distance between the source electrode and the drain electrode of any of said at least one first FET, and a distance between the gate electrode and the drain electrode of each of said at least one second FET is larger than a distance between the gate electrode and the drain electrode of any of said at least one first FET.

* * * * *